United States Patent
Hatakeyama

(10) Patent No.: US 6,385,753 B1
(45) Date of Patent: May 7, 2002

(54) PUNCTURED VITERBI DECODING METHOD

(75) Inventor: Izumi Hatakeyama, Tokyo (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 09/326,572

(22) Filed: Jun. 7, 1999

(30) Foreign Application Priority Data

Jun. 9, 1998 (JP) .......................................... 10-160345

(51) Int. Cl.$^7$ ............................................. H03M 13/03
(52) U.S. Cl. ........................ 714/796; 714/790; 714/795
(58) Field of Search ............................... 714/790, 792, 714/794, 795, 796

(56) References Cited

U.S. PATENT DOCUMENTS

| | | | |
|---|---|---|---|
| 4,777,636 A | * 10/1988 | Yamashita et al. | 714/795 |
| 5,208,816 A | * 5/1993 | Seshardi et al. | 714/795 |
| 5,408,502 A | * 4/1995 | How | 375/340 |
| 5,469,452 A | * 11/1995 | Zehavi | 714/792 |
| 5,742,622 A | * 4/1998 | Claydon et al. | 714/789 |
| 5,949,796 A | * 9/1999 | Kumar | 370/529 |
| 5,987,637 A | * 11/1999 | Thomas | 714/795 |
| 6,094,465 A | * 7/2000 | Stein et al. | 375/346 |
| 6,154,871 A | * 11/2000 | Claydon et al. | 714/795 |
| 6,246,698 B1 | * 1/2001 | Kumar | 370/487 |
| 6,199,190 B1 | * 3/2001 | Wan | 714/786 |

FOREIGN PATENT DOCUMENTS

| | | | |
|---|---|---|---|
| EP | 0409205 | 1/1991 | H03M/13/12 |
| EP | 2315001 | 1/1998 | H03M/13/12 |

OTHER PUBLICATIONS

Haccoun, D. and Begin, G.; High–rate punctured convolutional codes for Viterbi and sequential decoding; IEEE Transactions on Communications, vol: 37, Issue: 11, Nov. 1989, pp.: 1113–1125.*

Lee, L.H.C.; New rate–compatible punctured convolutional codes for Viterbi decoding; IEEE Transactions on Communications, vol.: 42 Issue: 12, Dec. 1994; pp: 3073–3079.*

Hagenauer, J.; Rate–compatible punctured convolutional codes (RCPC codes) and their applications; IEEE Transactions on Communications; vol: 36 Issue: 4, Apr. 1988; pp: 389–400.*

(List continued on next page.)

Primary Examiner—Albert Decady
Assistant Examiner—Joseph D. Torres
(74) Attorney, Agent, or Firm—Jay H. Maioli

(57) ABSTRACT

An ACS calculation is performed with received data and when the punctured process has not been performed, a trace-back process is performed in a loop. In this case, a punctured pattern of which data received at one time point, in those at three time points that have not been punctured, is used. Thus, the trace-back process is performed for the data at the time point. With the trace-back process performed once, decoded data at three time points including punctured data at two time points is generated. Since the trace-back process is not performed with punctured data as the start point, an error of decoded data can be prevented or suppressed.

7 Claims, 12 Drawing Sheets

OTHER PUBLICATIONS

Cypher, R. and Shung, C.B.; Generalized trace back techniques for survivor memory management in the Viterbi algorithm; IEEE Global Telecommunications Conference, 1990, and 'Communications: Connecting the Future' Exhibition, GLOBECOM '90; pp: 1318–132.*

Pellizzoni, R.; Sandri, A.; Spalvieri, A. and Biglieri, E.; Analysis and implementation of an adjustable–rate multilevel coded modulation system; IEE Proceedings– Communications, vol: 144 Issue: 1, Feb. 1997, pp: 1–5.*

Min–Goo Kim; On systematic punctured convolutional codes; IEEE Transactions on Communications, vol.: 45 Issue: 2, Feb., 1997, pp. 133–139.*

Seshadri, N. and Sundberg, C.–E.W.; List Viterbi decoding algorithms with applications; IEEE Transactions on Communications, vol: 42 Issue: 2 Part: 1, Feb –Apr. 1994; pp: 313–323.*

T.K. Truong et al. "A VLSI Design for a Trace–Back Viterbi Decoder," IEEE Transactions on Communications, vol. 40, No. 3, Mar. 1992.*

Rate–Compatible Punctured Convolutional Codes (RCPC Codes) And Their Applications, Joachim Hagenhauer, IEEE Transactions on Communications, vol. 36, No. 4, pp. 389–400, Apr. 1988.

Development of Variable–Rate Viterbi Decoder And Its Performance Characteristics, Tutaka Yusuda et al., Publication No. XP–000794033.

* cited by examiner

Fig. 3

| TRANSMISSION RATE | NUMBER OF SYMBOLS THAT HAVE BEEN INTERLEAVED | PUNCTURE | NUMBER OF SYMBOLS THAT HAVE BEEN CONVOLUTIONAL CODE ENCODED | CONVOLUTIONAL CODE ENCODING RATIO | DATA AMOUNT/ 20 msec | INFORMATION | CRC | ENCODER TAIL |
|---|---|---|---|---|---|---|---|---|
| 9600bps | 384 SYMBOLS | 4/6 | 576 SYMBOLS | 1/2 | 288 BITS | 268 BITS | 12BITS | 8 BITS |

| SYMBOL DATA | | | POLARITY | RELIABILITY | METRIC(Hex) | |
|---|---|---|---|---|---|---|
| bit2 | bit1 | bit0 | | | BM0 | BM1 |
| 0 | 1 | 1 | 0 | High | 0 | 7 |
| 0 | 1 | 0 | 0 | │ | 1 | 6 |
| 0 | 0 | 1 | 0 | │ | 2 | 5 |
| 0 | 0 | 0 | 0 | Low | 3 | 4 |
| 1 | 1 | 1 | 1 | Low | 4 | 3 |
| 1 | 1 | 0 | 1 | │ | 5 | 2 |
| 1 | 0 | 1 | 1 | │ | 6 | 1 |
| 1 | 0 | 0 | 1 | High | 7 | 0 |

Fig. 9

| STATE THREE TIME POINTS EARLIER | STATE TWO TIME POINTS EARLIER | STATE ONE TIME POINT EARLIER | LAST STATE |
|---|---|---|---|
| 00 | 00 | 00 | 00 |
| 20 | 40 | 80 | 00 |
| 40 | 80 | 00 | 00 |
| 60 | C0 | 80 | 00 |
| 80 | 00 | 00 | 00 |
| A0 | 40 | 80 | 00 |
| C0 | 80 | 00 | 00 |
| E0 | C0 | 80 | 00 |
| 00 | 00 | 00 | 01 |
| 20 | 40 | 80 | 01 |
| 40 | 80 | 00 | 01 |
| 60 | C0 | 80 | 01 |
| 80 | 00 | 00 | 01 |
| A0 | 40 | 80 | 01 |
| C0 | 80 | 00 | 01 |
| E0 | C0 | 80 | 01 |
| 00 | 00 | 01 | 02 |
| 20 | 40 | 81 | 02 |
| 40 | 80 | 01 | 02 |
| 60 | C0 | 81 | 02 |
| 80 | 00 | 01 | 02 |
| A0 | 40 | 81 | 02 |
| C0 | 80 | 01 | 02 |
| E0 | C0 | 81 | 02 |

Fig. 10

| STATE TWO TIME POINTS EARLIER | STATE ONE TIME POINT EARLIER | LAST STATE |
|---|---|---|
| 00 | 00 | 00 |
| 40 | 80 | 00 |
| 80 | 00 | 00 |
| C0 | 80 | 00 |
| 00 | 00 | 01 |
| 40 | 80 | 01 |
| 80 | 00 | 01 |
| C0 | 80 | 01 |
| 00 | 01 | 02 |
| 40 | 81 | 02 |
| 80 | 01 | 02 |
| C0 | 81 | 02 |

PUNCTURED VITERBI DECODING METHOD

BACKGROUND OF THE INVENTION

1. Field of the Invention

The present invention relates to a punctured Viterbi decoding method for use with a digital mobile communication apparatus or the like.

2. Description of the Related Art

In an information transmission system using a high accuracy decoding method such as the Viterbi decoding method, a punctured process for thinning out convolutional code at a predetermined ratio is performed on the transmission side so as to increase information amount per data transmission unit. When two bits are thinned out from six bits of convolutional code by the punctured process, the information amount per transmission data unit can be increased by 1.5 times.

When convolutional code encoded data that has been punctured-processed is maximum-likelihood decoded by the Viterbi algorithm, regardless of whether a branch metric is generated with or without a punctured data portion, the following decoding process is performed.

In other words, after a decoding process including an ACS calculation is started, a trace-back process is performed from the maximum likelihood state at a predetermined process time point. Decoded data is generated corresponding to the data that is obtained at the traced back time point as a result of calculation. Such a process sequence is successively performed at each process time point so as to obtain required decoded data.

In such a decoding process, if convolutional code encoded data that has been punctured contains many errors, data to be calculated for generating a branch metric corresponding to the punctured data may become inaccurate. Thus, a branch metric value corresponding to the punctured data may become inaccurate. Consequently, the maximum likelihood state obtained as the result of the ACS calculation corresponding to the branch metric value may become inaccurate.

To allow the trace-back process to converge a particular path to a correct path and improve the decoding accuracy, the length of the path memory that performs a trace-back process should be increased. However, when such a path memory is used, the circuit scale becomes large and a high speed clock is required. Alternatively, the process speed decreases.

OBJECTS AND SUMMARY OF THE INVENTION

Therefore, an object of the present invention is to provide a punctured Viterbi decoding method that allows the decoding accuracy to be improved without need to increase the length of the path memory that performs the trace-back process.

The present invention is a punctured Viterbi decoding method that performs maximum-likelihood decoding using the Viterbi algorithm for data that has been generated as a result of an operation that thins out data at predetermined intervals of a convolutional code, comprising the steps of (a) detecting whether or not received data has been thinned out for each decoding process unit composed of a predetermined number of symbols, (b) calculating the value of a branch metric for each decoding process unit corresponding to the received data, (c) performing ACS calculation for calculating values of path metrics for a plurality of states corresponding to the result of step (b), the number of states having been predetermined corresponding to convolutional code encoding process, selecting the maximum likelihood state transition corresponding to the values of the calculated path metrics, and generating path selection information that represents the selected result, (d) performing a trace-back process for generating decoded data corresponding to the values of the path metrics and the path selection information, (e) setting an initial value corresponding to the decoding process unit and prohibiting step (d) when the decoding process unit has been thinned out as the determined result of step (a), and (f) setting an initial value corresponding to the decoding process unit and executing step (d) when the decoding process unit has not been thinned out as the determined result of step (a).

According to the present invention, the trace-back process is prohibited with an initial value that is set corresponding to punctured data.

Since the trace-back process is not performed with an initial value corresponding to punctured data, an incorrect maximum likelihood path corresponding to an error of convolutional code is not used. Consequently, a decoded error can be prevented or suppressed.

These and other objects, features and advantages of the present invention will become more apparent in light of the following detailed description of a best mode embodiment thereof, as illustrated in the accompanying drawings.

BRIEF DESCRIPTION OF THE DRAWINGS

FIG. 3 is a schematic diagram for explaining an example of a convolutional code data format for use with a transmitting/receiving system according to the present invention;

FIG. 9 is a schematic diagram showing an example of state transitions among three time points;

FIG. 10 is a schematic diagram showing an example of state transitions between two time points.

DETAILED DESCRIPTION OF THE PREFERRED EMBODIMENT

Figure 1:
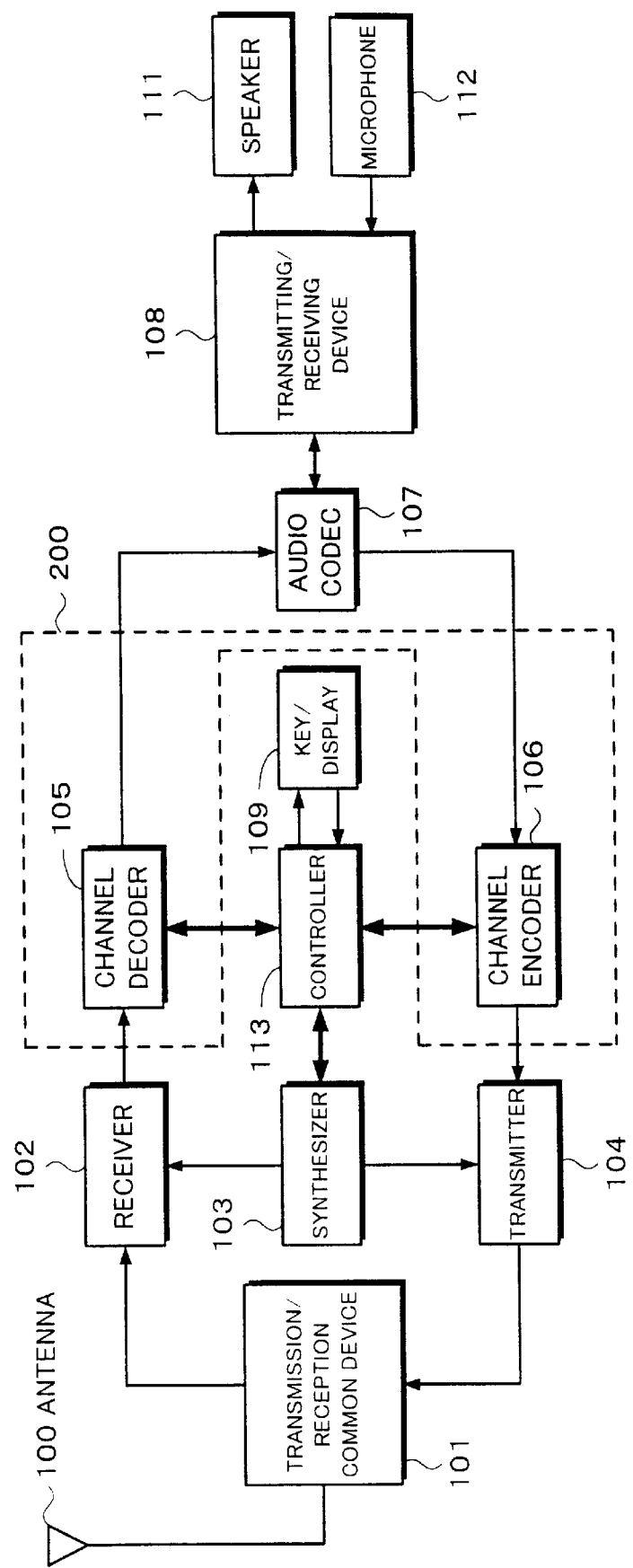
FIG. 1 is a block diagram for explaining the overall structure of an embodiment of the present invention.

Next, with reference to the accompanying drawings, a terminal of a digital mobile communication apparatus according to an embodiment of the present invention will be described. First of all, with reference to FIG. 1, the overall structure of the embodiment of the present invention will be described. Radio data is transmitted to or received from a base station through an antenna 100. A transmission/reception common device 101 is connected to the antenna 100. The transmission/reception common device 101 supplies received radio data to a receiver 102. In addition, the transmission/reception common device 101 receives transmission radio data from a transmitter 104.

Next, the structure of the receiving side will be described. The receiver 102 demodulates the received radio data and supplies the demodulated data to a channel decoder 105. The channel decoder 105 performs a format converting process and a decoding process for audio and communication control information of the received signal. The resultant signal is supplied to an audio codec 107. The audio codec 107 decodes the output signal of the channel decoder 105 into an audio information signal. The audio information signal is supplied to a transmitting/receiving device 108. The transmitting/receiving device 108 drives a speaker 111 corresponding to the received information so as to generate voice.

Next, the structure of the transmitting side will be described. A microphone 112 converts input voice into a predetermined signal. The converted signal is supplied to the transmitting/receiving device 108. The transmitting/receiving device 108 generates an audio information signal corresponding to the received signal. The audio information signal is supplied to the audio codec 107. The audio codec 107 encodes the audio information signal. The encoded signal is supplied to a channel encoder 106. The channel encoder 106 performs a format converting process and an encoding process for voice and communication control information of the supplied signal. The processed signal is supplied to the transmitter 104. The transmitter 104 superimposes the signal received from the channel encoder 106 as radio data on a carrier and supplies the resultant signal to the transmission/reception common device 101.

A synthesizer 103 controls a transmission/reception frequency. On the other hand, a controller 113 generates, interprets, sets, cancels, and maintains communication control information. In addition, the controller 113 controls the synthesizer 103 and input/output of a key/display portion 109. The key/display portion 109 has for example a key input portion and a display portion. The key input portion allows the user to set a transmission destination. The display portion has for example a liquid crystal display panel and displays information of a transmission destination and so forth that have been set with the key input portion. In the following description, the channel decoder 105 and the channel encoder 106 are generally referred to as channel codec 200.

Figure 2:
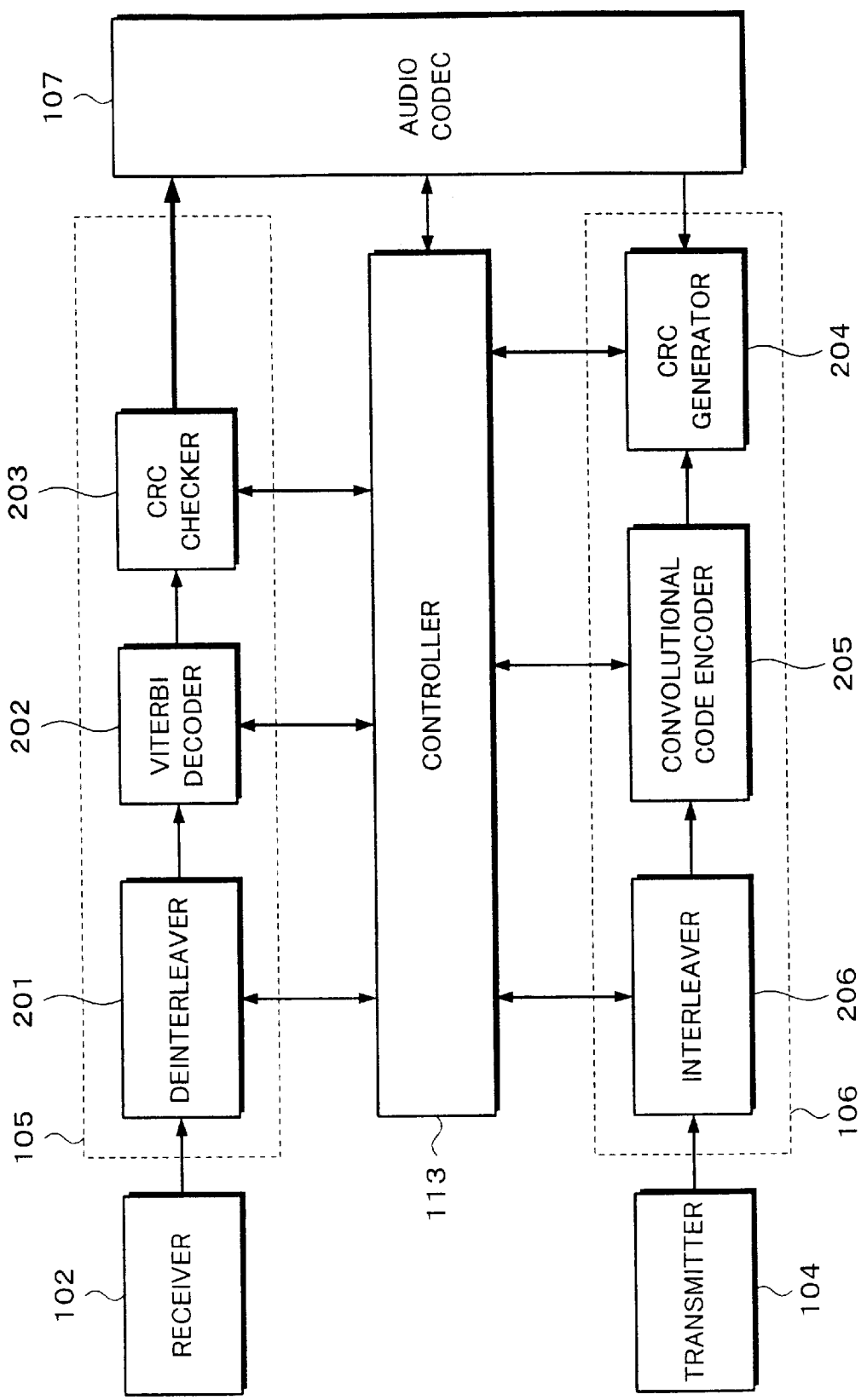
FIG. 2 is a block diagram for explaining a part of the structure of the embodiment of the present invention.

Next, with reference to FIG. 2, the channel codec 200 will be described in detail. The channel encoder 106 has a CRC (Cyclic Redundancy Code) generator 204, a convolutional code encoder 205, and an interleaver 206. These structural elements operate corresponding to commands issued from the controller 113. The audio information signal is supplied from codec 107 to CRC generator 204. The control information signal is supplied from controller 113 to CRC generator 204.

As will be described later, the CRC generator 204 adds CRC to the signal received from the audio codec 107. The resultant signal is supplied to the convolutional code encoder 205. The convolutional code encoder 205 performs an error correction code encoding process for the signal received from the CRC generator 204 and generates convolutional code. The convolutional code is supplied to the interleaver 206. The interleaver 206 performs an interleaving process for the convolutional code. The resultant signal is supplied to the transmitter 104.

When the interleaving process and deinterleaving process (that will be described later) are performed, even if a burst error takes place in transmission data, data to be decoded contains only a random error. With these processes, in particular, a burst error that causes a decode error rate in Viterbi decoding process to remarkably increase can be removed.

On the other hand, the channel decoder 105 has a deinterleaver 201, a Viterbi decoder 202, and a CRC checker 203. These structural elements operate corresponding to commands issued from the controller 113. Data received from the receiver 102 is supplied to the deinterleaver 201. The deinterleaver 201 performs a deinterleaving process for the signal received from the receiver 102. The resultant signal is supplied to the Viterbi decoder 202.

The Viterbi decoder 202 performs an error correcting process for the signal received from the deinterleaver 201. The resultant signal is supplied to the CRC checker portion 203. The CRC checker portion 203 detects an error of the signal with the CRC contained therein. An audio information signal of the output signal of the CRC checker portion 203 is supplied to the audio codec 107. On the other hand, a control data signal of the output signal of the CRC checker portion 203 is supplied to the controller 113.

Next, with reference to FIG. 3, an example of the data format according to the embodiment of the present invention will be described. In the example shown in FIG. 3, data is transmitted as frames at intervals of 20 msec. The transmission rate is 9600 bps. The number of symbols that have been interleaved is 384. In this example, six symbols are punctured to four symbols. The number of symbols that have been convolutional code encoded is 578. The convolutional code encoding ratio is ½. The data amount in 20 msec is 288 bits. The number of audio information bits is 268. The number of CRC bits is 12. The number of tail bits is 8.

Figure 4:
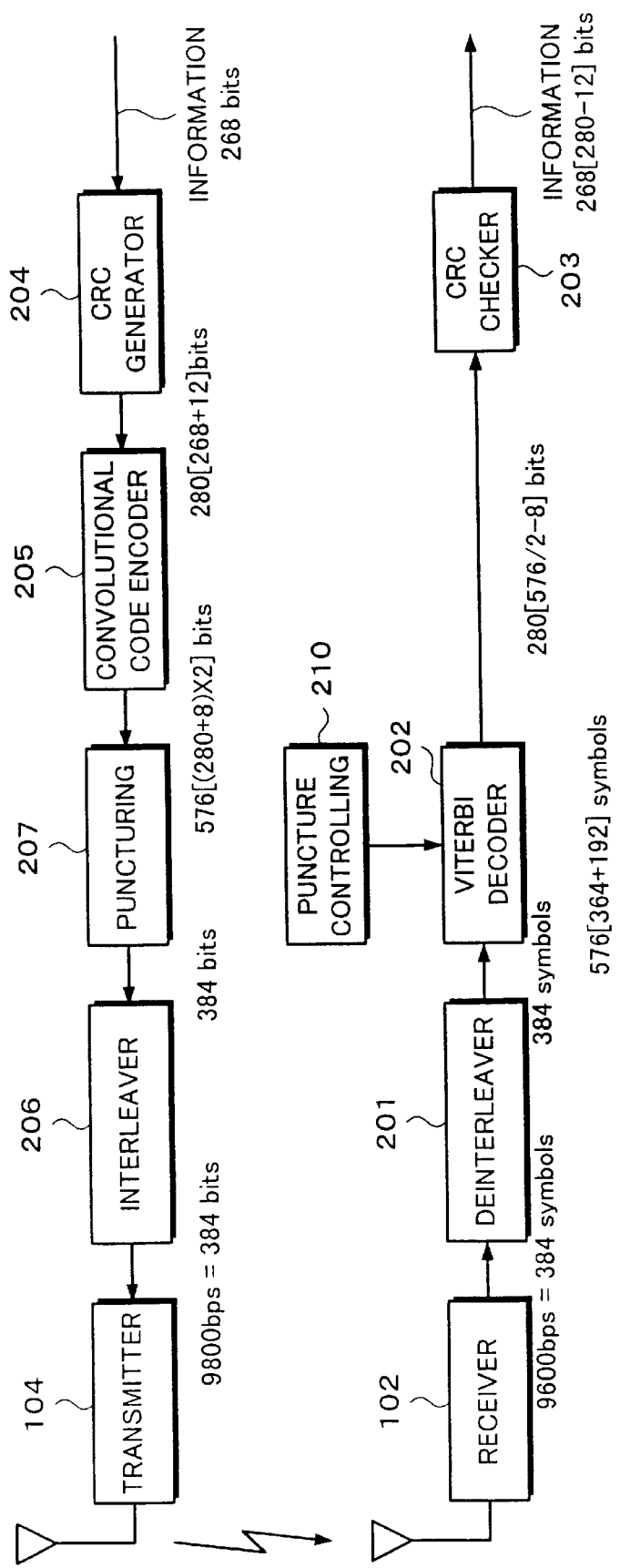
FIG. 4 is a block diagram for explaining a data transmitting/receiving process according to the embodiment of the present invention.

Next, with reference to FIG. 4, the processes of the transmitting system and the receiving system will be described in detail. First of all, the process of the transmitting system will be described. Information of 268 bits generated at a time is supplied to the CRC generator 204. The CRC generator 204 generates 12 CRC bits corresponding to a generating polynomial expressed by formula (1).

The 12 CRC bits are added to the 268-bit information. Thus, a 280-bit signal is generated. And, the tail bits that are composed of 8 bits of '0' are added to 280-bit signal. Thus, a 288-bit signal is generated. The tail bits are added to the end of the convolutional code so as to cause the convolutional code encoder to output the last (restriction length–1) bits of the convolutional code. The number of tail bits is (restriction length–1). The resultant signal containing the tail bits is supplied to the convolutional code encoder 205 whose restriction length k=9 and encoding ratio R=½. The convolutional code encoder 205 performs a convolutional code encoding process (that will be described later) for the signal received from the CRC generator 204 and generates a 576-bit signal as convolutional code.

The convolutional code generated by the convolutional code encoder 205 is supplied to a punctured processing portion 207. The punctured processing portion 207 performs a punctured process (namely, a data thin-out process corresponding to a pattern expressed by formula (2)) for the convolutional code so as to convert the convolutional code into 384-bit data equivalent to ⅔ encoding process.

Puncturing pattern: "110101"  (2)

where "0" is a bit to be deleted; "1" is a bit to be used.

In the punctured process corresponding to the pattern expressed by formula (2), 576-bit data is divided into six-bit blocks. In each block, the first, second, fourth, and sixth bits are used. The third and fifth bits are thinned out. In other words, since such bits are not used, but removed, six-bit data is converted into four-bit data. Thus, 576-bit data is converted into four-bit data. Thus, 576-bit data is converted into 384-bit data. The 384-bit data is supplied to the interleaver 206. After data sequence is changed by the interleaver 206, the resultant data is supplied to the transmitter 104. The transmitter 104 outputs the data received from the interleaver 206 to a radio circuit.

Next, the process of the receiving system will be described in detail. The receiver 102 receives radio data and supplies data of 384 symbols per frame to the deinterleaver 201. The deinterleaver 201 has a storing circuit. After a predetermined amount of data is stored in the storing circuit, the deinterleaver 201 deinterleaves the data received from the storing circuit so as to change the data sequence to the original data sequence. The resultant data is supplied to the Viterbi decoder 202.

According to the embodiment of the present invention, an intra-frame bit interleaving process is performed. In the intra-frame bit interleaving process, each frame is interleaved. Thus, after symbol data for one frame is stored in the storing circuit, the deinterleaver 201 deinterleaves the symbol data.

The Viterbi decoder 202 performs the decoding process corresponding to the output signal of the deinterleaver 201 and generates decoded data. Since the decoding process is performed with reference to timing of the punctured data received from the punctured controlling portion 210, punctured data can be highly likelihood decoded. The decoded data is supplied to the CRC checker portion 203. The CRC checker portion 203 checks the decoded data with the 12-bit CRC generated and added corresponding to the polynomial expressed by formula (1).

Figure 5:
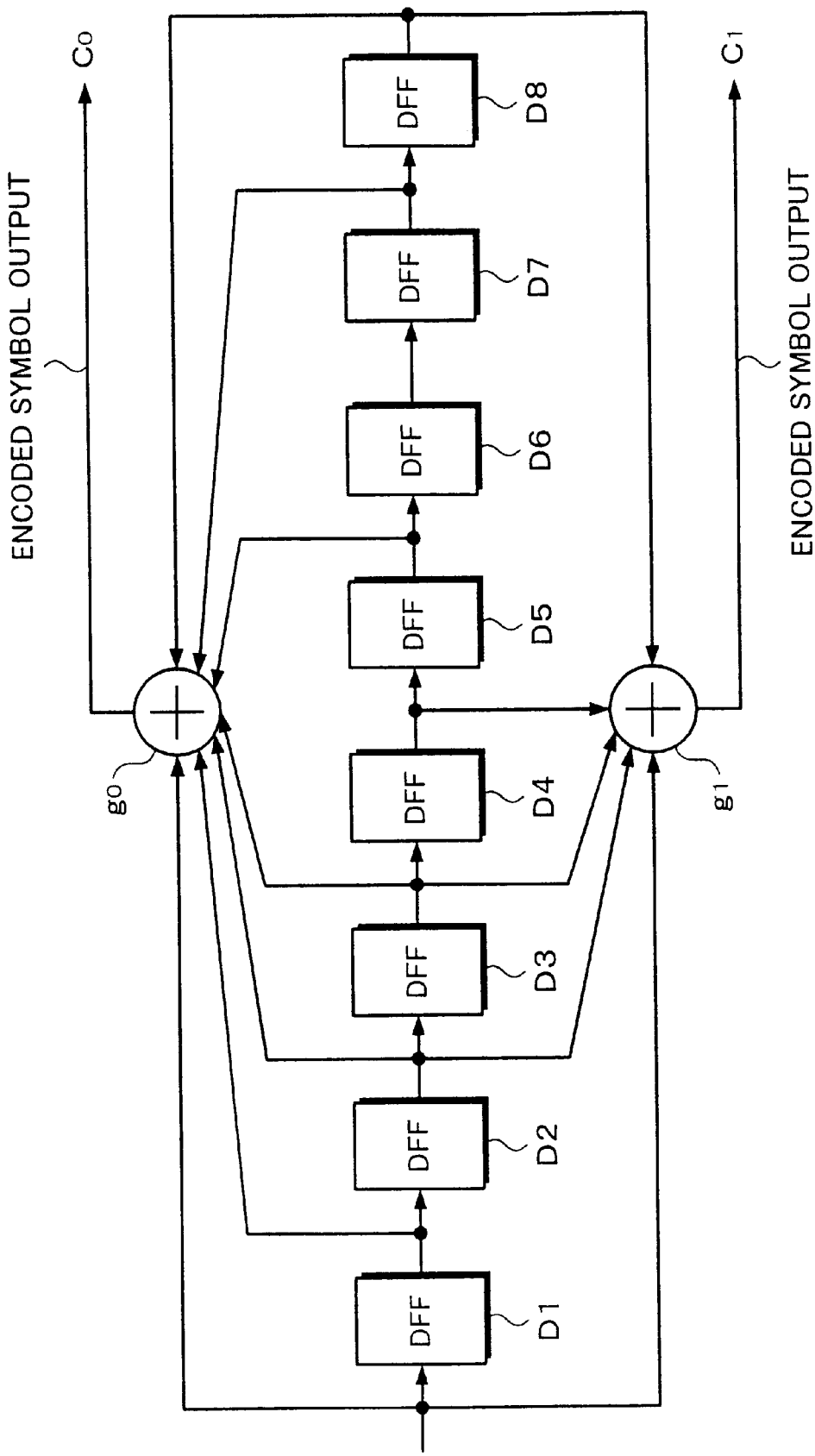
FIG. 5 is a block diagram showing an example of the structure of a convolutional code encoder.

Next, with reference to FIG. 5, the convolutional code encoder 205 will be described. The convolutional code encoder 205 has eight registers D1, D2, D3, D4, D5, D6, D7, and D8 and calculators $g_0$ and $g_1$. The registers delay respective signals by one clock period. The calculators $g_0$ and $g_1$ are for example mod2 multiplying devices. Each bit of the supplied signal and output signals of the registers D1, D2, D3, D5, D7, and D8 are supplied to a calculator $g_0$. In addition, each bit of the supplied signal and output signals of the registers D2, D3, and D8 are supplied to the calculator $g_1$. The calculator $g_0$ calculates each data received from the registers D1, D2, D3, D5, D7, and D8 and outputs an encoded symbol $C_0$. On the other hand, the calculator $g_1$ calculates each data received from the registers D2, D3, and D8 and outputs an encoded symbol $C_1$. These encoded symbols compose convolutional code.

Next, the decoding process of the Viterbi decoder 202 will be described. Since convolutional code encoding/Viterbi decoding system has been used in the embodiment of the present invention, data to be decoded is used as coarse determination data. In the embodiment of the present invention, the data to be decoded is processed as eight-value coarse determination data. Generally, the Viterbi decoder performs a calculating process for input data corresponding to Viterbi algorithm. In other words, the Viterbi decoder selects the maximum likelihood path that transits to each state as a survival path. Whenever survival paths are selected for a predetermined path length, the Viterbi decoder selects the maximum likelihood path from the survival paths. In such a manner, the Viterbi decoder decodes the received signal.

In this example, each state has been defined corresponding to each decoding method. For example, in the embodiment of the present invention, convolutional code whose restriction length k=9 and encoding ratio R=½ is used. In the decoding process for the convolutional code whose restriction length k=9, $2^{k-1} \ne 2^{9-1}$=256 states are used. In the embodiment of the present invention, the number of storage stages of path selection information (namely, the number of stored time points of past path selection information) is 64.

The Viterbi decoder 202 converts 384-symbol data into 576-symbol data, performs maximum likelihood decoding process whose restriction length k=9 and encoding ratio R=½ for the converted data corresponding to Viterbi algorithm, and outputs decoded 280-bit data.

Figure 6:
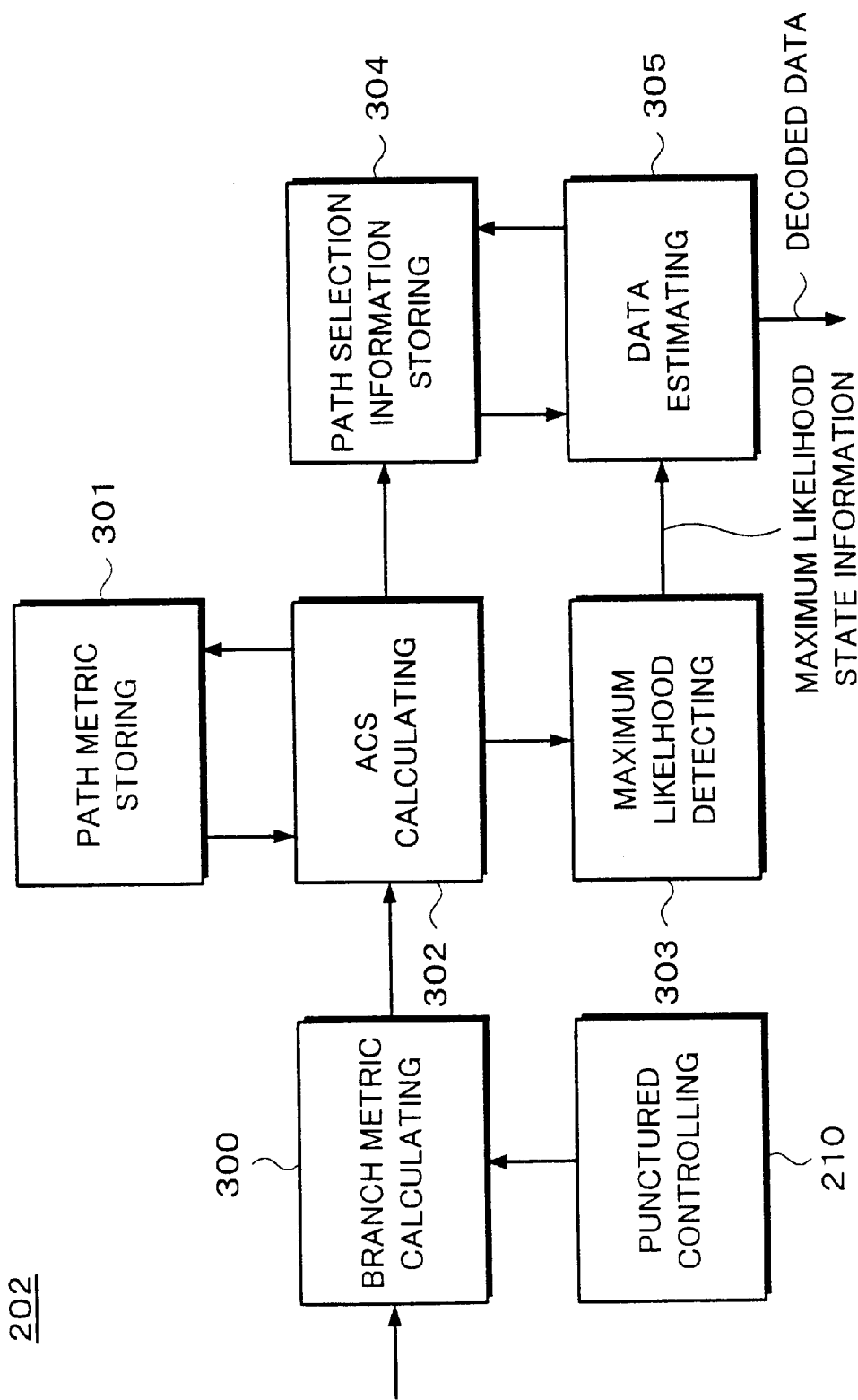
FIG. 6 is a block diagram showing an example of the structure of a Viterbi decoder according to the embodiment of the present invention.

Next, with reference to FIG. 6, the structure and operation of the Viterbi decoder 202 will be described in m ore detail. The Viterbi decoder 202 has a branch metric calculating portion 300, an ACS (Add Compare Select) calculating portion 302, a path metric storing portion 301, a path selection information storing portion 304, a maximum likelihood detecting portion 303, and a data estimating portion 305. The path selection information storing portion 304 has for example 64 stages of storing circuits.

The branch metric calculating portion 300 calculates a branch metric value (for example, Euclidian distance) between received data at each time point corresponding to clock pulses and each branch and supplies the calculated branch metric value to the ACS calculating portion 302. The ACS calculating portion 302 performs an ACS calculation (that will be described later) corresponding to the received branch metric value so as to calculate a path metric value in each state. In addition, the ACS calculating portion 302 selects a survival path corresponding to the calculated path metric value and supplies the calculated path metric value to the path metric storing portion 301 and the maximum likelihood detecting portion 303. Moreover, the ACS calculating portion 302 generates path selection information that represents the selected result of the survival path and supplies the path selection information to the path selection information storing portion 304.

The path metric storing portion 301 stores the received path metric value in each state. As will be described later, the stored path metric values are used to perform the ACS calculation one clock period later. In addition, the path selection information storing portion 304 stores path selection information (estimated output signals of paths). The maximum likelihood detecting portion 303 generates maximum likelihood state information corresponding to a path metric value in each state and supplies the maximum likelihood state information to the data estimating portion 305. The data estimating portion 305 estimates data with the maximum likelihood state information and past path selection information that is read from the path selection information storing portion 304 and outputs decoded data.

Next, the branch metric generating process of the branch metric calculating portion 300 will be described in detail. In the 9600 bps format shown in FIG. 3, the branch metric calculating portion 300 processes two symbols of received data (384 symbols) at a time so as to generate branch metrics. At this point, the branch metric calculating portion 300 compensates punctured data with reference to the timing of punctured data.

The branch metric calculating portion 300 generates BM(0,0), BM(0,1), BM(1,0), and BM(1,0) corresponding polarities "00", "01", "10", and "11" of successive two symbols. The process for two symbols at a time is performed because the convolutional code encoding ratio R is ½ in the above-described format.

Figures 7, 8:
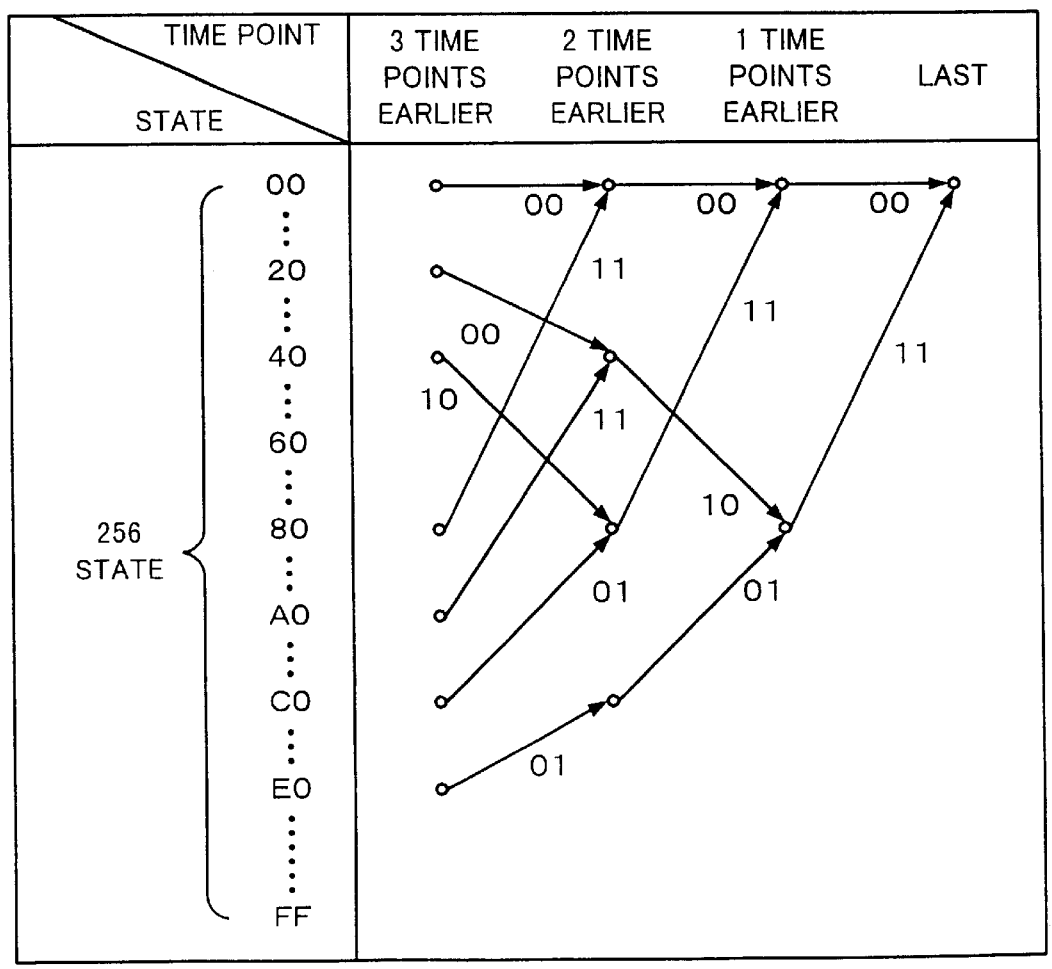
FIG. 7 is a schematic diagram for explaining a method for generating a branch metric according to the embodiment of the present invention.
FIG. 8 is a schematic diagram for explaining a state transition among three time points.

FIG. 7 shows an example of the relation of branch metrics corresponding to successive three symbols of data supplied to the branch metric calculating portion 300. In this example, it is assumed that the branch metric value corresponding to the maximum likelihood state is "0". When normal data that has not been punctured is supplied, the branch metric calculating portion 300 outputs values of branch metrics BM0 and BM1 in the following manner.

In other words, when "011" that represents polarity "0" and high reliability state is supplied, the value of the metric BM0 that represents the probability of state 0 is "0" that represents the maximum likelihood state. The value of the metric BM1 that represents the probability of state 1 is "7". When "100" that represents polarity "1" and high reliability state is supplied, the value of the metric BM0 that represents the probability of state 0 is "7". The value of the metric BM1 that represents the probability of state 1 is "0". Whenever one symbol is input, a combination of successive three bits is updated and the values of the branch metrics BM0 and BM1 are generated. Thus, one value of the branch metric BM0 and one value of the branch metric MB1 are generated with one symbol.

In such a manner, BM0(A), BM1(A), BM0(B), and BM1 (B) are generated corresponding to the successive two symbols A and B. Corresponding to successive two symbols, branch metrics BM(0,0), BM(0,1), BM(1,0), and BM(1,1) are calculated as follows.

$$BM(0,0)=BM0(A)+BM0(B) \quad (3)$$

$$BM(0,1)=BM0(A)+BM1(B) \quad (4)$$

$$BM(1,0)=BM1(A)+BM0(B) \quad (5)$$

$$BM(1,1)=BM1(A)+BM1(B) \quad (6)$$

When the punctured controlling portion 210 supplies timing of punctured data, the values of both the branch metrics BM0 and BM1 corresponding to symbol data are "0". Thus, the value of a branch metric in each state corresponding to a punctured data portion does not relatively vary. This is because punctured data portions do not have information. Alternatively, the values of branch metrics BM0 and BM1 may be "1".

Thus, in formulas (3) to (6), when data A corresponds to timing of punctured data, since the values of the branch metrics BM0(A) and BM1(A) are "0". Thus, the branch metrics BM(0,0), BM(0,1), BM(1,0), and BM(1,1) are expressed by formulas (3)', (4)', (5)', and (6)', respectively.

$$BM(0,0)=BM0(B) \quad (3)'$$

$$BM(0,1)=BM1(B) \quad (4)'$$

$$BM(1,0)=BM0(B) \quad (5)'$$

$$BM(1,1)=BM1(B) \quad (6)'$$

Next, the ACS calculation will be described in detail. As described above, transitions from one state to other states are pre-defined corresponding to the encoding method. The ACS calculation is a calculating process for selecting the maximum likelihood path from a plurality of paths that can be transited to individual states. Next, with reference to FIG. 8, state transitions among three time points for convolutional code corresponding to the embodiment of the present invention will be described. FIG. 8 shows an example of transitions to state 00.

Each state is transited from two states. For example, state S00 (new) is transited from state S00 (old) at the preceding time point and state S80 (old) at the preceding time point. When state S00 (new) is transited from state S00 (old) and state S80 (old), it is clear that input codes should be (0,0) and (1,1), respectively. Thus, the maximum likelihood path is generally selected in the following manner.

First, in the above-described manner, the value of a branch metric is calculated. Corresponding to the calculate value of the branch metric and the value of a path metric at the preceding time point, the value of a new path metric is calculated. In addition, corresponding to the value of the new path metric, the likelihood of the path is obtained and a survival path is selected. To perform such a calculation for symbols one clock period later, the value of the new path metric is stored.

Next, transitions to state 00 as a new state will be described in more detail. The values of new path metrics S00 (new)a and S00 (new) b transited from states 00 and 80 are calculated as expressed by formulas (7) and (8).

$$S00(new)a=S00(old)a+BM(0,0) \quad (7)$$

$$S00(new)b=S80(old)b+BM(1,1) \quad (8)$$

where S00 (old)a and S00 (old)b are the values of path metric at the preceding time point. The value of a path metric S00 (new) corresponding to a high likelihood path is selected from the values of path metrics calculated by formulas (7) and (8).

$$S00(new)=S00(new)a(where\ S00(new)a<S00(new)b) \quad (9)$$

$$S00(new)=S00(new)b(otherwise) \quad (10)$$

In the case of formula (9), a path transited from state 00 (state 00→state 00) at the preceding time point is the maximum likelihood state. In the case of formula (10), a path transited from state 80 (state 80→state 00) at the preceding time point is the maximum likelihood state. Thus, when the restriction length k is 9, since there are 256 states that can be transited ($2^{9-1}$=256), the above-described calculating process and selecting process are performed for the 256 states. FIG. 9 shows transitions to state 00 (see FIG. 8), state 01, and state 02. As described above, the ACS calculating portion 302 generates path selection information that represents path selected results for 256 states.

The ACS calculation is performed corresponding to data for three time points. In the calculation, one of $2^3$=8 path metrics is selected as the maximum likelihood path. In reality, as a practical example, when state 00 is transited as a new state from eight old states, the values of path metrics S00(new)<0> to S00(new)<8> that take place among three time points are calculated.

$$S00(new)<0>=S00(old)+BM[0](0,0)+BM[1](0,0)+BM[2](0,0) \quad (11)$$

$$S00(new)<1>=S20(old)+BM[0](0,0)+BM[1](1,0)+BM[2](1,1) \quad (12)$$

$$S00(new)<2>=S40(old)+BM[0](1,0)+BM[1](1,1)+BM[2](0,0) \quad (13)$$

$$S00(new)<3>=S60(old)+BM[0](1.0)+BM[1](0,1)+BM[2](1.1) \quad (14)$$

$$S00(new)<4>=S80(old)+BM[0](1,1)+BM[1](0,0)+BM[2](0,0) \quad (15)$$

$$S00(new)<5>=SA0(old)+BM[0](1,1)+BM[1](1,0)+BM[2](1,1) \quad (16)$$

$$S00(new)<6>=SC0(old)+BM[0](0,1)+BM[1](1,1)+BM[2](0,0) \quad (17)$$

$$S00(new)<7>=SE0(old)+BM[0](0,1)+BM[1](0,1)+BM[2](0,0) \quad (18)$$

A path corresponding to the minimum value of path metrics S00 (new)<0> to S00 (new)<8> is selected as the maximum likelihood path. In other words, a path corresponding to the value of the path metric S00 (new) selected in the following manner is treated as the maximum likelihood path.

$$S00(new)=\min\{S00(new)<0>, S00(new)<1>, S00(new)<2>,\\ S00(new)<3>, S00(new)<4>, S00(new)<5>, S00(new)<6>,\\ S00(new)<7>\} \quad (19)$$

Thus, a three-bit path selection signal that represents the selected result is generated. When the restriction length k is 9, the above-described maximum likelihood path selecting process is performed for a total of 256 states.

In this example, the ACS calculation for selecting a state transition among three time points was described. However, the present invention can be applied to the case of the ACS calculation for selecting a state transition between two time points. FIG. 10 shows transitions to states 00, 01, and 02 between two time points. In this example, the number of states depends on the restriction length K. When the restriction length K is 9, the number of states becomes 256.

The path selection information storing portion 304 stores path selection information. The maximum likelihood detecting portion 303 selects the maximum likelihood state from path metrics corresponding to the 256 states. In other words, the maximum likelihood detecting portion 303 selects a state corresponding to the minimum value of a path metric and supplies the maximum likelihood state number to the data estimating portion 305. The data estimating portion 305 reads data from the path selection information storing portion 304 with reference to the maximum likelihood state number, performs the trace-back process, and generates decoded data.

Next, the trace-back process will be described. When the trace-back process is started, a state corresponding to the maximum likelihood number generated by the maximum likelihood state detecting portion 303 is set as an initial state. With reference to the initial state, path selection information is read from the path selection information storing 304. In other words, path selection information of paths to the initial state is read. Thus, the state numbers of the preceding states are obtained. Thereafter, path selection information of paths to the preceding state is read. Thus, the state numbers of the states earlier than the initial state by two time points are obtained. The same process is repeated for the length of the path memory. Data corresponding to the oldest path selection information is treated as decoded data. Such a process is referred to as trace-back process.

According to the present invention, the trace-back process is controlled depending on whether or not the punctured process is performed. In other words, at timing of non-punctured data, the trace-back process is performed and decoded data is generated. In the punctured process corresponding to formula (2), the punctured process is omitted once for three branch metrics generated. Thus, the trace-back process is performed once for three branch metrics generated. When the oldest path selection information is traced back, a decoded data value obtained corresponding to the oldest path selection information and decoded data values obtained corresponding to path selection information traced back one time point later and two time points later than the oldest path selection information are output as three-bit decoded data.

After the last ACS calculation is performed, a process corresponding to the tail bits that have been set in the convolutional code encoding process is performed. As described above (see FIG. 4), according to the embodiment of the present invention, when the convolutional code encoding process is performed, since tail bits (eight bits) have been set, the trace-back process is performed from state 00 as the initial state. Path selection information obtained in each trace-back process for one time point is treated as decoded data. However, when the tail bits have not been set, after the last ACS calculation is completed, the trace-back process is started from the maximum likelihood state number at the time point as the initial state.

When the convolutional code encoding process is performed for each frame, the initial value of a path metric of the ACS calculation is set as follows. In this case, since "0" is set as the initial value of the convolutional code encoder, the convolutional code that is initially output becomes a sequence of "0s". Thus, in state 00, "0" is used as the initial value of a path metric of the ACS calculation. In other states, as the initial value of a path metric of the ACS calculation, the value of a path metric corresponding to a sequence of "0s" is weighted.

Figure 11A:
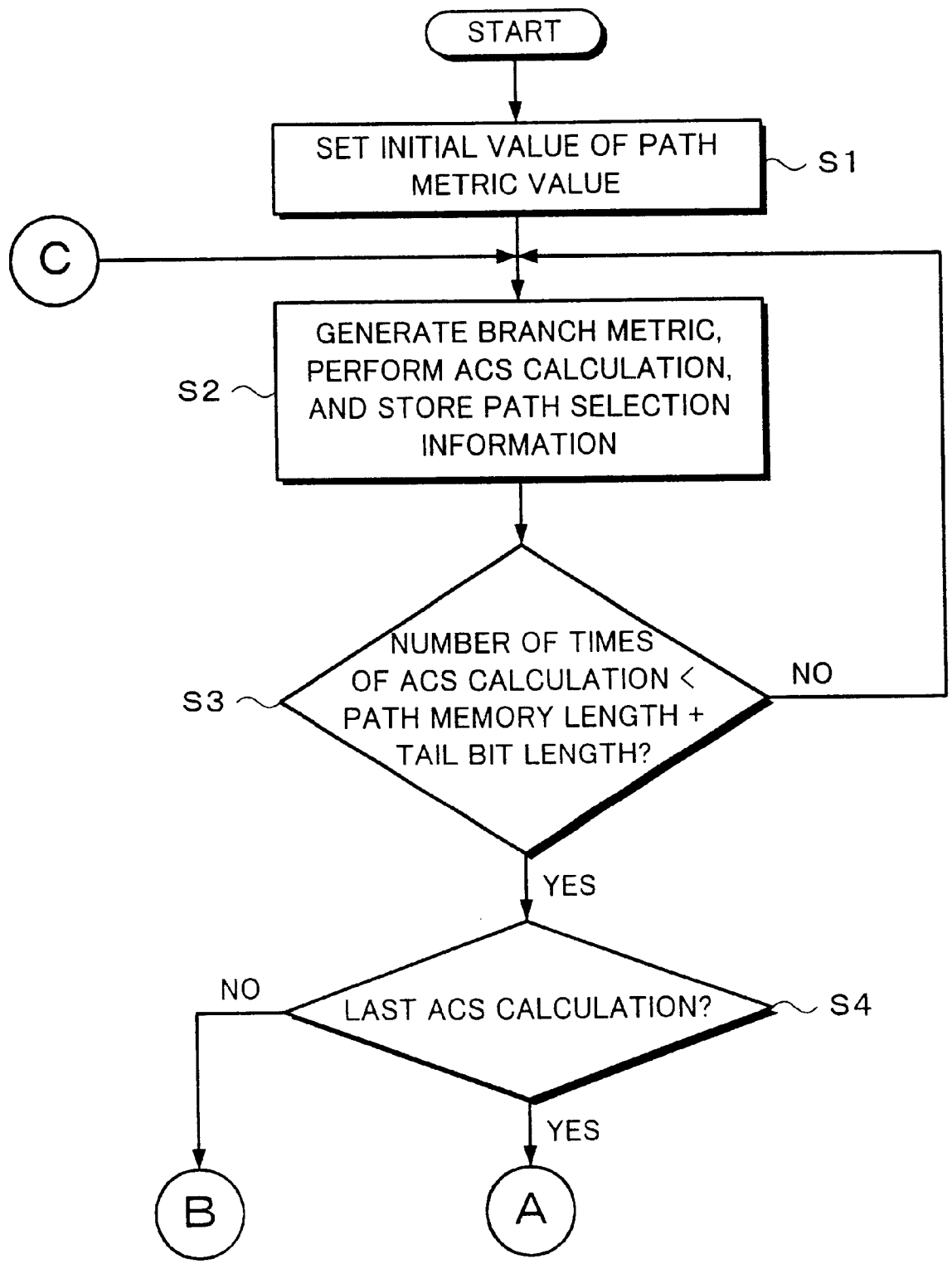
FIGS. 11A to 11C are schematic diagrams for explaining a process of a punctured Viterbi decoding method according to the embodiment of the present invention.
Figure 11B:
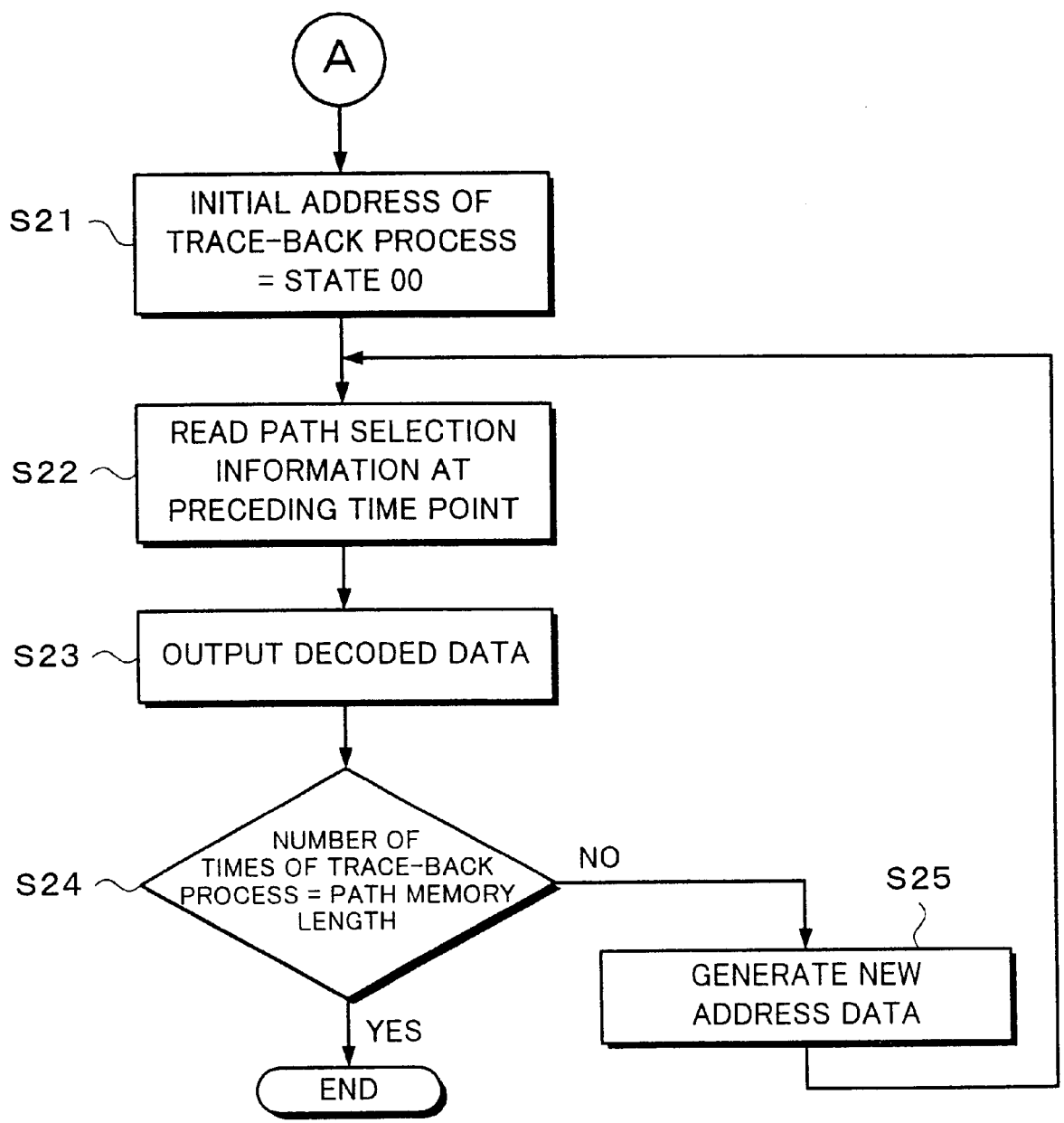
Figure 11C:
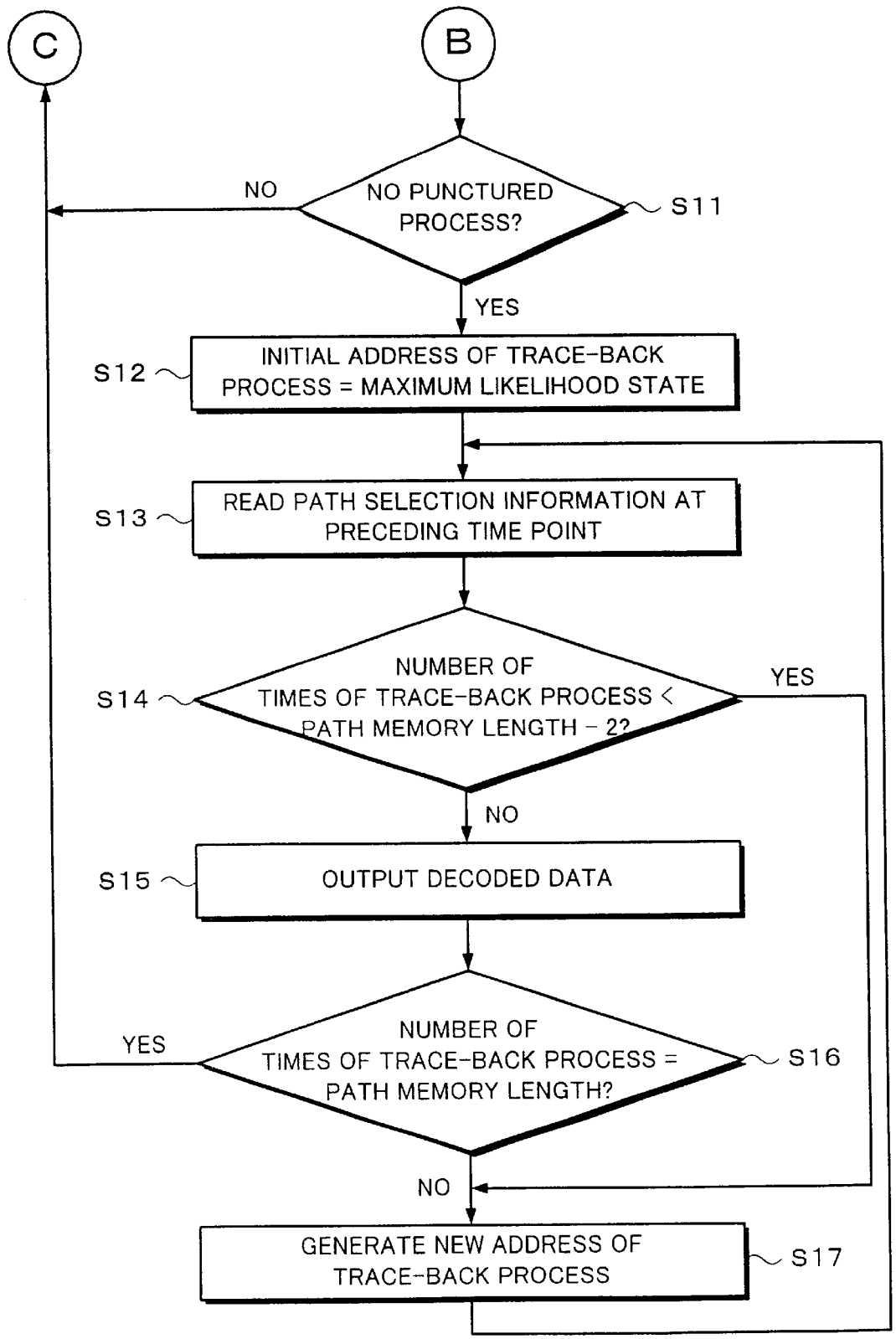

Next, with reference to FIGS. 11A to 11C, a Viterbi decoding process according to the embodiment of the present invention will be described. At step S1, the Viterbi decoding process is started and an initial value of a path metric is set. Thereafter, the flow advances to step S2. At step S2, the branch metric calculating portion 300 generates branch metrics in a process unit of two symbols. The ACS calculating portion 302 generates new path metric information and path selection information.

At the point, the branch metric calculating portion 300 generates branch metrics with reference to timing of punctured data received from the punctured controlling portion 210. The new path metric information is stored in the path metric storing portion 301. On the other hand, the new path selection information is stored in the path selection information storing portion 304.

At step S3, it is determined whether or not the number of times of the ACS calculation is smaller than the value of (path memory length+tail bit length). When the determined result at step S3 is Yes, the flow returns to step S2. When the determined result at step S3 is No, the flow advances to step S4. In other words, after the ACS calculation is performed the number of times corresponding to the value of (path memory length+tail bit length), the flow advances to step S4. The ACS calculation is performed corresponding to timing of non-punctured data (in this example, the ACS calculation is performed once for three branch metrics generated).

After the number of times of the ACS calculation exceeds the value of (path memory length+tail bit length) until the last ACS calculation is completed, a loop starting from step S11 is performed. At step S11, it is determined whether or not the punctured process has been performed. When the determined result at step S11 is Yes, the flow advances to step S12. Thus, for a puncturing pattern expressed by formula (2), the data estimating portion 305 performs the trace-back process once for three branch metrics generated.

At step S12, the maximum likelihood state detected by the maximum likelihood detecting portion 303 is set as an initial address of the trace-back process (namely, the initial state of the trace-back process). At step S13, path selection information at the preceding time point (namely, as the result of the preceding ACS calculation) is read from the path selection information storing portion 304.

At step S14, it is determined whether or not the number of times of the trace-back process is smaller than the value of (path memory length−2). When the determined result at step S14 is Yes, the flow advances to step S17. When the determined result at step S14 is No, the flow advances to step S15. At step S17, a new trace-back address is generated with the path selection information that is read at step S13. Thereafter, the flow advances to step S13. At step S13, the trace-back process is repeated. On the other hand, at step S15, decoded data is output. Thereafter, the flow advances to step S16. At step S15, it is determined whether or not the number of times of the trace-back process is equal to the value of bus memory length. When the determined result at step S15 is Yes, the flow returns to step S2. When the determined result at step S15 is No, the flow advances to step S17.

Thus, when the number of times of the trace-back process is equal to the value of (path memory length−2), the value of (path memory length−1), or the value of (path memory length), decoded data is output. Consequently, in the loop starting from step S11 (namely, by the trace-back process performed corresponding to timing of non-punctured data), a total of three bits of decoded data including two bits of decoded data of symbols corresponding to timing of non-punctured data is output. When the number of times of the trace-back process becomes equal to the value of path memory length, the trace-back process is completed. Thereafter, branch metrics are generated. The ACS calculation is performed. The path selection information is stored.

When the determined result at step S4 is Yes, the flow advances to step S21. As was described above, according to the embodiment of the present invention, in the convolutional code encoding process, tail bits (successive eight "0s") are added. Thus, at step S21, state 00 is set as the initial address of the trace-back process corresponding to the tail bits rather than the maximum likelihood state information generated by the maximum likelihood detecting portion 303. Thus, in a loop starting from step S21, the data estimating portion 305 performs the trace-back process with the initial address of state 00.

As described above, as tail bits, a sequence of "1s" can be used instead of a sequence of "0s". In this case, at step S21, an optimum state corresponding to added tail bits is set as the initial address of the trace-back process.

In other words, at step S22, path selection information at the preceding time point is read from the path selection information storing portion 304. At step S23, one bit of decoded data is output. At step S24, it is determined whether or not the number of times of the trace-back process is equal to the value of path memory length. When the determined result at step S24 is Yes, the process is completed. When the determined result at step S24 is No, the flow advances to step S25. At step S25, with the decoded data, a new trace-back address is generated. Thereafter, the flow advances to step S22. In the loop starting from step S21, the trace-back process and decoded data output are repeated until the number of times of the trace-back process becomes equal to the value of path memory length.

When the convolutional code encoding process is performed for each frame, a predetermined number of fixed numeric characters "0s" (for example, equal to the number of stages of registers of the convolutional code encoder) are successively input and the convolutional code encoder is initialized. In consideration of such a situation, in state 00, "0" may be used as the initial value of a path metric of the ACS calculation. In states other than state 00, values of corresponding to a sequence of "0s" as symbol data may be used. In other words, a weighted value for initializing the convolutional code encoder can be set as the initial value of a path metric in the ACS calculation.

Alternatively, as described above, as with the trace-back process, the ACS calculation may be controlled depending on whether or not the punctured process is performed. In other words, when the punctured process is not performed, with the ACS calculation and the trace-back process, decoded data is generated. Thus, with a puncturing pattern expressed by formula (2), the ACS calculation and trace-back process are performed once for three branch metrics generated. A total of three bits of information at the oldest three time points that have been traced back are treated as decoded data.

According to the embodiment of the present invention, the initial state (initial address) of the trace-back process is treated as the maximum likelihood state detected corresponding to the result of the ACS calculation. Alternatively, in consideration of tail bits added, the initial state of the trace-back process is treated as state 0 under a predetermined condition. As another alternative method, in consideration of the characteristics of the system, another state may be set as the initial state.

According to the embodiment of the present invention, the restriction length K of the convolutional code is 9 and the encoding ratio R is ½. However, the present invention can be applied to the case that the restriction length K is not 9 and the encoding ration R is not ½.

The embodiment of the present invention is applied to a mobile communication apparatus. However, the present invention can be applied to an information transmission apparatus that performs a punctured Viterbi decoding process.

Although the present invention has been shown and described with respect to a best mode embodiment thereof, it should be understood by those skilled in the art that the foregoing and various other changes, omissions, and additions in the form and detail thereof may be made therein without departing from the spirit and scope of the present invention.

What is claimed is:

1. A punctured Viterbi decoding method that performs maximum-likelihood decoding using a Viterbi algorithm corresponding to data that has been generated as a result of an operation that thins out data at predetermined intervals of a convolutional code, comprising the steps of:

(a) detecting whether received data has been thinned out for each decoding process unit composed of a predetermined number of symbols;

(b) calculating a value of a branch metric for each decoding process unit corresponding to the received data;

(c) performing ACS calculation for calculating values of path metrics for a plurality of states corresponding to the result of the step of calculating, the number of states having been predetermined corresponding to a convolutional code encoding process, selecting a maximum likelihood state transition corresponding to the values of the calculated path metrics, and generating path selection information that represents a result of the step of selecting;

(d) performing a trace-back process for generating decoded data corresponding to the values of the path metrics and the path selection information;

(e) prohibiting the step of performing a trace-back process when the decoding process unit has been thinned out as indicated by a determined result of the step of detecting; and (f) setting an initial value corresponding to the decoding process unit and executing the step of performing a trace-back process when the decoding process unit has not been thinned out as indicated by the determined result of the step of detecting.

2. The punctured Viterbi decoding method as set forth in claim 1, wherein when the trace-back process at the step of performing a trace-back process is executed at the step of setting, decoded data corresponding to the decoding process unit that has not been thinned out as the determined result at the step of detecting and decoded data corresponding to the decoding process unit that has been thinned out as the determined result at the step of detecting are generated.

3. The punctured Viterbi decoding method as set forth in claim 1, further comprising the step of:
prohibiting the step of performing ACS calculation at a timing of the decoded process unit that has been thinned out as the determined result at the step of detecting and executing the step of performing ACS calculation at a timing of the decoded process unit that has not been thinned out as the determined result at the step of detecting.

4. The punctured Viterbi decoding method as set forth in claim 3, wherein when the trace-back process at the step of performing trace-back processing and the ACS calculation at the step of performing ACS calculation are executed, the ACS calculation and decoded data output are performed for the decoded process unit that has not been thinned out as the determined result at the step of detecting and the ACS calculation and decoded data output are performed for the decoded process unit that has been thinned out as the determined result at the step of detecting.

5. The punctured Viterbi decoding method as set forth in claim 1, wherein the data that is to be decoded is generated through a convolutional code encoding process which is completed for a predetermined amount of data and a convolutional code encoder is initialized whenever the convolutional code encoding process is completed, and wherein a value weighted with reference to the value of a path metric of each state in the case that an output of the convolutional code encoder is a fixed value "0" in the convolutional code sequence is set as the value of the path metric in the initial state at the step of performing ACS calculation.

6. The punctured Viterbi decoding method as set forth in claim 1, wherein the data that is to be decoded is generated through a convolutional code encoding process which is completed for a predetermined amount of data and tail bits are added to the end of the encoded data whenever the convolutional code encoding process is completed, and wherein when an amount of received data is smaller than a predetermined amount of data that is the process data unit at the step of performing a trace-back processing, after step of performing ACS calculation is performed for all the data, the step of performing a trace-back process is performed from a state corresponding to the tail bits.

7. The punctured Viterbi decoding method as set forth in claim 1, wherein the data that is to be decoded is generated through a convolutional code encoding process which is completed for a predetermined amount of data and tail bits are added to an end of the encoded data whenever the convolutional code encoding process is completed, and wherein when an amount of the received data is larger than the predetermined amount of data that is the process data unit at the step of performing a trace-back processing, and the step of performing ACS calculation and when an amount of remaining data to be decoded is smaller than the predetermined amount of data that is the process data unit at the step of performing a trace-back processing, after the step of performing ACS calculation is performed corresponding to the remaining data, the step of performing trace-back processing is performed from a state corresponding to the tail bits.

* * * * *